(12) United States Patent
Yamada et al.

(10) Patent No.: US 11,419,250 B2
(45) Date of Patent: Aug. 16, 2022

(54) NOISE SUPPRESSION SHEET

(71) Applicant: TDK CORPORATION, Tokyo (JP)

(72) Inventors: Takashi Yamada, Tokyo (JP); Atsushi Sato, Tokyo (JP); Makoto Orikasa, Tokyo (JP); Hideharu Moro, Tokyo (JP)

(73) Assignee: TDK CORPORATION, Tokyo (JP)

( * ) Notice: Subject to any disclaimer, the term of this patent is extended or adjusted under 35 U.S.C. 154(b) by 58 days.

(21) Appl. No.: 16/876,882

(22) Filed: May 18, 2020

(65) Prior Publication Data

US 2021/0360840 A1    Nov. 18, 2021

(51) Int. Cl.
*H05K 9/00*    (2006.01)

(52) U.S. Cl.
CPC ......... *H05K 9/0088* (2013.01); *H05K 9/0084* (2013.01)

(58) Field of Classification Search
CPC .......................... H05K 9/0088; H05K 9/0084
See application file for complete search history.

(56) References Cited

U.S. PATENT DOCUMENTS

| | | | | |
|---|---|---|---|---|
| 2013/0306364 A1* | 11/2013 | Suzuki | ................. | H05K 9/0088 174/394 |
| 2014/0141267 A1* | 5/2014 | Kagawa | ............... | H05K 9/0084 428/458 |
| 2016/0057898 A1* | 2/2016 | Lai | .......................... | H01L 23/60 156/220 |

* cited by examiner

*Primary Examiner* — Hung V Ngo
(74) *Attorney, Agent, or Firm* — Oliff PLC

(57) ABSTRACT

A noise suppression sheet comprises a non-magnetic metal layer, a plurality of metal magnetic layers, and a plurality of insulating layers, and the metal magnetic layer and the insulating layer are alternately laminated on the non-magnetic metal layer. The noise suppression sheet can absorb and suppress noise generated from a circuit or the like in an electronic component by being mounted on the electronic component or the like. In the noise suppression sheet, noise is absorbed by each of the metal magnetic layers. Noise that is transmitted without being absorbed by the metal magnetic layer can be reflected by the non-magnetic metal layer and can be absorbed again by the metal magnetic layer, and hence the noise suppression sheet can suppress noise effectively.

8 Claims, 1 Drawing Sheet

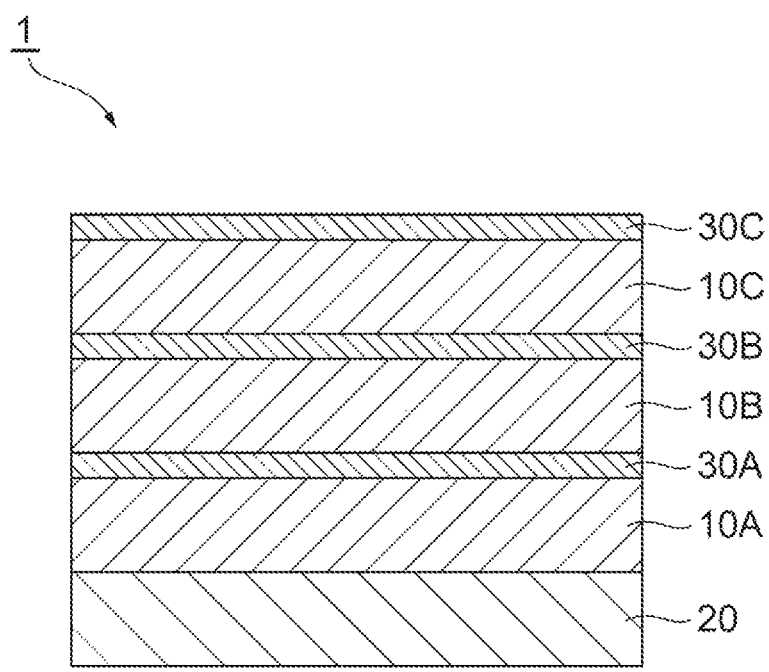

NOISE SUPPRESSION SHEET

TECHNICAL FIELD

The present disclosure relates to a noise suppression sheet.

BACKGROUND

In recent years, along with increasing operation speed of a digital circuit in an electronic apparatus, erroneous operation of the electronic apparatus or an adverse effect on a human body caused by noise such as electromagnetic waves generated from the circuit has been deepening. For this reason, development of a noise suppression sheet for suppressing (blocking) noise has been progressed.

SUMMARY

The present inventors have performed research on the magnetic shielding characteristics of the noise suppression sheet, and as a result, have newly found a technology that achieves excellent magnetic shielding characteristics.

The present disclosure provides a noise suppression sheet with improved magnetic shield characteristics.

The noise suppression sheet according to an embodiment of the present disclosure comprises a non-magnetic metal layer, a plurality of metal magnetic layers, and a plurality of insulating layers, and the metal magnetic layer and the insulating layer are alternately laminated on the non-magnetic metal layer.

In the noise suppression sheet according to another aspect, the thickness of each of insulating layers is 1 to 3 μm.

In the noise suppression sheet according to another aspect, the thickness of each of the metal magnetic layer is less than 0.5 to 3 μm.

In a noise suppression sheet according to another aspect, each of the metal magnetic layer is composed of a FeNi alloy, a FeSiAl alloy, a FeNiMo alloy, or a FeNiCo alloy.

In the noise suppression sheet according to another aspect, the thickness of the non-magnetic metal layer is 0.5 to 20 μm.

In the noise suppression sheet according to the other aspect, the non-magnetic metal layer is composed of at least one selected from the group consisting of Cu and Al.

BRIEF DESCRIPTION OF THE DRAWINGS

FIG. 1 is a schematic sectional view showing one embodiment of a noise suppression sheet; and

DETAILED DESCRIPTION

Some embodiments of the present disclosure are described below, with reference as necessary to the drawings. However, the present disclosure is not limited to the following embodiments.

FIG. 1 is a schematic sectional view showing one embodiment of a noise suppression sheet. The noise suppression sheet 1 shown in FIG. 1 has a multilayer structure, and comprises three metal magnetic layers 10A, 10B, and 10C, a non-magnetic metal layer 20, and three insulating layers 30A, 30B, and 30C. More specifically, the noise suppression sheet 1 has a seven-layer structure, and metal magnetic layers 10A, 10B and 10C and insulating layers 30A, 30B and 30C are alternately laminated on the non-magnetic metal layer 20. The uppermost layer of the noise suppression sheet 1 is the insulating layer 30C. From the viewpoint of thinning, the noise suppression sheet 1 is designed so that its thickness is 100 μm or less.

Each of the metal magnetic layers 10A, 10B, and 10C is a thin film composed of a magnetic material, and is composed of, for example, a FeNi alloy (permalloy), or a FeSiAl alloy (sendust). In the present embodiment, each of the metal magnetic layers 10A, 10B, and 10C is composed of a FeNi alloy containing 70 to 84 wt % of Ni and containing 16 to 30 wt % of Fe. Each of the metal magnetic layers 10A and 10B may be an alloy in which Mo is added to FeNi (FeNiMo alloy), or may be an alloy in which Co is added to FeNi (FeNiCo alloy). Mo or Co may be added at 2 to 8 wt %. The constituent material of the metal magnetic layer 10A, the constituent material of the metal magnetic layer 10B, and the constituent material of the metal magnetic layer 10C may be the same or different. Each of the metal magnetic layers 10A, 10B, and 10C have a high magnetic permeability and can function as a magnetic shield layer that absorbs noise.

In the present embodiment, the thickness of each of the metal magnetic layers 10A, 10B, and 10C is designed to be 0.5 to 3 μm (1 μm as an example). From the viewpoint of thinning the noise suppression sheet 1, the thickness of each of the metal magnetic layers 10A, 10B, and 10C may be 2 μm or less or 1 μm or less. From the viewpoint of more effectively absorbing noise, the thickness of each of the metal magnetic layers 10A, 10B, and 10C may be 1 μm or more or 2 μm or more. The thickness of the metal magnetic layer 10A, the thickness of the metal magnetic layer 10B, and the thickness of the metal magnetic layer 10C may be the same or different.

Each of the metal magnetic layers 10A, 10B, and 10C is designed to have a high electrical resistivity, and the electrical resistivity of each of the metal magnetic layers 10A, 10B, and 10C according to the present embodiment is 70 to 115 μΩ·cm (95 μΩ·cm as an example).

The metal magnetic layers 10A, 10B, and 10C can be obtained by coating or plating (electrolytic plating or electroless plating).

The non-magnetic metal layer 20 is a foil or thin film composed of a non-magnetic metal. Examples of the non-magnetic metal constituting the non-magnetic metal layer 20 include Cu, Al, Sn, and Bi. The non-magnetic metal layer 20 may be composed of a single non-magnetic metal or a plurality of non-magnetic metals having different metal species. The non-magnetic metal layer 20 according to the present embodiment is composed of at least one selected from the group consisting of Cu and Al. The non-magnetic metal layer 20 functions as an electromagnetic wave shield that reflects electromagnetic noise.

The thickness of the non-magnetic metal layer 20 is designed to be 0.5 to 20 μm (for example, 10 μm). The thickness of the non-magnetic metal layer 20 may be 1 μm or more or 5 μm or more from the viewpoint of effectively reflecting electromagnetic noise, and may be 15 μm or less or 10 μm or less, from the viewpoint of thinning the noise suppression sheet 1.

When the non-magnetic metal layer 20 is a foil (or sheet), the non-magnetic metal layer 20 can be obtained by, for example, rolling or sheeting. When the non-magnetic metal layer 20 is a thin film, the non-magnetic metal layer 20 can be obtained by electrolytic processing or vapor deposition.

Each of the insulating layers 30A, 30B, and 30C is composed of an insulating material. The insulating layers 30A and 30B are interposed between the metal magnetic layers 10A, 10B and 10C, and the insulating layer 30C constitutes the uppermost layer of the noise suppression sheet 1. The thickness of each of the insulating layers 30A, 30B, and 30C is 1 to 3 μm, for example, 2 μm. The thickness of the insulating layer 30A, the thickness of the insulating layer 30B, and the thickness of the insulating layer 30C may be the same or different. Each of the insulating layer 30A, 30B, and 30C can be formed by, for example, printing a resin.

The method of obtaining the above noise suppression sheet 1 is not particularly limited, and various methods can be employed. For example, the thin film-shaped metal magnetic layers 10A, 10B, and 10C and the insulating layer 30A, 30B, and 30C are alternately formed into films on the non-magnetic metal layer 20 by electrolytic processing or vapor deposition, allowing the noise suppression sheet 1 to be formed.

The above noise suppression sheet 1 can absorb and suppress noise (magnetism, electromagnetic waves, and the like) generated from a circuit or the like in an electronic component by being mounted on the electronic component or the like. In the noise suppression sheet 1, noise is absorbed by the metal magnetic layers 10A, 10B, and 10C. Noise that is transmitted without being absorbed by the metal magnetic layers 10A, 10B, and 10C can be reflected by the non-magnetic metal layer 20 and can be absorbed again by the metal magnetic layers 10A, 10B, and 10C, and hence the noise suppression sheet 1 can suppress noise effectively.

Moreover, according to the noise suppression sheet 1, an excellent magnetic shielding characteristic is achievable. In the noise suppression sheet 1, particularly, a high electrical resistivity of 70 to 115 μΩ·cm is achieved in the metal magnetic layers 10A, 10B, and 10C, high magnetic permeability is maintained even in a high frequency band of about 1 MHz to 10 GHz, and the frequency dependence of the dielectric constant is reduced.

The noise suppression sheet 1 has high magnetic shield characteristics, and hence it can be thinned while maintaining practically sufficient magnetic shield characteristics as a noise suppression sheet.

In the above noise suppression sheet 1, the function of a magnetic shield for absorbing noise is enhanced by providing a plurality of metal magnetic layers 10A, 10B, and 10C on the non-magnetic metal layer 20. The above noise suppression sheet 1 has three sets of the metal magnetic layer and the insulating layer, but may have two sets or four or more sets. As the number of the set of the metal magnetic layer and the insulating layer increases, the magnetic shield effect in a high frequency band of about 1 MHz to 10 GHz is more enhanced.

The number of metal magnetic layers and the number of insulating layers may be the same or different. For example, the insulating layer can be interposed between the non-magnetic metal layer 20 and the metal magnetic layer 10A, and in the case of this configuration, the number of insulating layers is larger than the number of metal magnetic layers.

In the above noise suppression sheet 1, a plurality of metal magnetic layers 10A, 10B, and 10C are integrated to function as one metal magnetic layer. In this case, the thickness of each of the insulating layers 30A, 30B, and 30C is selected as a thickness such that the metal magnetic layers 10A, 10B, and 10C are electrically separated while the magnetic coupling between the metal magnetic layers 10A, 10B, and 10C is maintained. The magnetic coupling between the metal magnetic layers 10A, 10B, and 10C is improved as the thickness of each of the insulating layers 30A, 30B, and 30C is reduced.

In the noise suppression sheet 1, the thickness of each of the metal magnetic layers 10A, 10B, and 10C is 0.5 to 3 μm, and thus the thinning and improved flexibility are achieved.

In the noise suppression sheet 1, the thickness of the non-magnetic metal layer 20 is 0.5 to 20 μm, and thus the thinning and improved flexibility are achieved.

What is claimed is:

1. A noise suppression sheet comprising:
   a non-magnetic metal layer;
   a plurality of metal magnetic layers; and
   a plurality of insulating layers, wherein
   the metal magnetic layer and the insulating layer are alternately laminated on the non-magnetic metal layer,
   the noise suppression sheet has a magnetic shield effect in a high frequency band of about 1 MHz to 10 GHz,
   the noise suppression sheet has a thickness of 100 μm or less,
   a thickness of each of the metal magnetic layers is 0.5 to 3 μm, and
   the electrical resistivity of each magnetic metal layer is 70 to 115 μΩ·cm.

2. The noise suppression sheet according to claim 1, wherein a thickness of each of the insulating layers is 1 to 3 μm.

3. The noise suppression sheet according to claim 1, wherein each of the metal magnetic layers is composed of a FeNi alloy, a FeSiAl alloy, a FeNiMo alloy, or a FeNiCo alloy.

4. The noise suppression sheet according to claim 1, wherein a thickness of the non-magnetic metal layer is 0.5 to 20 μm.

5. The noise suppression sheet according to claim 1, wherein the non-magnetic metal layer is composed of at least one selected from the group consisting of Cu and Al.

6. The noise suppression sheet according to claim 1, which has two or more sets of the metal magnetic layer and the insulating layer.

7. The noise suppression sheet according to claim 1, wherein an insulating layer is the uppermost layer.

8. The noise suppression sheet according to claim 1, wherein no insulator layer is interposed between a non-magnetic metal layer and a metal magnetic layer immediately above the non-magnetic metal layer.

* * * * *